US008766674B1

(12) United States Patent
Park et al.

(10) Patent No.: US 8,766,674 B1
(45) Date of Patent: Jul. 1, 2014

(54) CURRENT-MODE BUFFER WITH OUTPUT SWING DETECTOR FOR HIGH FREQUENCY CLOCK INTERCONNECT

(71) Applicant: QUALCOMM Incorporated, San Diego, CA (US)

(72) Inventors: Dongmin Park, San Diego, CA (US); Li Liu, San Diego, CA (US); Sujiang Rong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/834,861

(22) Filed: Mar. 15, 2013

(51) Int. Cl.
*H03K 3/00* (2006.01)
*H03K 7/02* (2006.01)
*H03K 5/02* (2006.01)
*H03K 17/16* (2006.01)

(52) U.S. Cl.
USPC ........... 327/112; 327/180; 327/389; 327/538; 327/548; 326/30

(58) Field of Classification Search
CPC .......... H03K 3/3565; H03K 19/00315; H03K 19/00361; H03K 19/0005; H03K 19/0013; H03K 5/12; H03K 17/162; H03K 17/54; H02M 1/38; G11C 5/147; G05F 3/262; G05F 3/242; G05F 3/205; H04L 25/0278; H04L 25/0298
USPC ................. 327/108–112, 170, 379–391, 530, 327/538–551, 205, 206, 436, 427, 434, 327/437; 326/82, 83, 21–34
See application file for complete search history.

(56) References Cited

U.S. PATENT DOCUMENTS

| 4,539,489 | A | * | 9/1985 | Vaughn | 327/206 |
| 5,594,361 | A | * | 1/1997 | Campbell | 326/24 |
| 5,939,937 | A | * | 8/1999 | Terletzki | 327/541 |
| 6,316,977 | B1 | * | 11/2001 | Sargeant | 327/157 |
| 6,356,106 | B1 | * | 3/2002 | Greeff et al. | 326/30 |
| 7,477,221 | B2 | | 1/2009 | Miyazawa et al. | |
| 7,493,149 | B1 | | 2/2009 | Doyle et al. | |
| 7,502,719 | B2 | | 3/2009 | Moraveji | |
| 7,902,904 | B2 | * | 3/2011 | Kumar et al. | 327/534 |
| 8,319,530 | B2 | | 11/2012 | Zhao et al. | |
| 2009/0179679 | A1 | * | 7/2009 | Chuang et al. | 327/170 |
| 2011/0298518 | A1 | | 12/2011 | Kim et al. | |

* cited by examiner

*Primary Examiner* — Lincoln Donovan
*Assistant Examiner* — Thomas Skibinski
(74) *Attorney, Agent, or Firm* — Arent Fox LLP

(57) ABSTRACT

A high-speed current-mode clock driver includes feedback circuitry to maintain the voltage swing of a biasing node within a defined range. The current-mode clock driver includes a PMOS and an NMOS transistor receiving an oscillating signal at their gate terminals. The drain terminals of the PMOS and NMOS transistors are respectively coupled to input terminals of first and second variable conductivity circuits whose output terminals are coupled to a common node. A control circuit increases the conductivities of the first and second variable conductivity circuits in response to decreases in voltage swing of the common node, and decreases the conductivities of the first and second variable conductivity circuits in response to increases in voltage swing of the common node. The first and second variable conductivity circuits are optionally PMOS and NMOS transistors respectively.

44 Claims, 4 Drawing Sheets

US 8,766,674 B1

CURRENT-MODE BUFFER WITH OUTPUT SWING DETECTOR FOR HIGH FREQUENCY CLOCK INTERCONNECT

BACKGROUND OF THE INVENTION

The present invention relates to Integrated Circuits (IC), and more particularly to a high-frequency clock interconnect circuit used in ICs.

An IC often includes a clock interconnect circuit adapted to generate a multitude of clock signals that control the operations of the various blocks disposed in the IC. Controlling the variation in the arrival times of the clock signals, commonly referred to as clock skew, is important.

Clock skew is dependent on two main parameters, namely the loading seen by the clock signal, as well as the RC delay of the clock interconnect. As is well known, clock skew increases the cycle times and reduces the rate at which the IC can operate. A number of different clock drivers have been developed to compensate for the differential delays of individual clock signals in order to minimize clock skew.

As the operating frequency of an IC increases, the power consumption of various components of a clock distribution circuit, such as the local oscillator (LO) and the phase locked-loop (PLL), starts to increase. To reduce the power consumption at high frequencies, current-mode clock drivers/buffers have been developed. Conventional current-mode clock drivers, however, are designed to operate under worst case voltage, temperature and process conditions. As such, conventional current-mode buffers are not power efficient. Controlling the power consumption of a clock interconnect circuit operating at relatively high frequencies remains a challenge.

BRIEF SUMMARY OF THE INVENTION

A current-mode driver circuit, in accordance with one embodiment of the present invention includes, in part, a first PMOS transistor, a first NMOS transistor, first and second variable conductivity circuits, and a control circuit. The first PMOS transistor has a gate terminal receiving an oscillating signal and a source terminal receiving a first supply voltage. The first NMOS transistor has a gate terminal receiving the oscillating signal and a source terminal receiving a second supply voltage. The first variable conductivity circuit has a first input terminal coupled to a drain terminal of the first PMOS transistor and an output terminal coupled to a common node. The second variable conductivity circuit has a first input terminal coupled to a drain terminal of the first NMOS transistor and an output terminal coupled to the common node. The control circuit is adapted to increase the conductivities of the first and second variable conductivity circuits in response to decreases in voltage swing of the common node, and further to decrease the conductivities of the first and second variable conductivity circuits in response to increases in voltage swing of the common node.

In one embodiment, the first variable conductivity circuit is a PMOS transistor (second PMOS transistor) having a source terminal coupled to the drain terminal of the first PMOS transistor and a drain terminal coupled to the common node. In one embodiment, the second variable conductivity circuit is an NMOS transistor (second NMOS transistor) having a source terminal coupled to the drain terminal of the first NMOS transistor and a drain terminal coupled to the common node.

In one embodiment, the current-mode clock driver circuit further includes a first biasing circuit that, in turn, includes a first current mirror, a first capacitor, and a first differential amplifier. The first differential amplifier includes a third NMOS transistor whose source terminal is responsive to the voltage of the common node. The first differential amplifier further includes a fourth NMOS transistor receiving the current generated by the first current mirror and having a gate terminal coupled to the gate terminal of the third NMOS transistor.

In one embodiment, the first biasing circuit further includes, in part, a resistive element coupled between the source terminal of the fourth NMOS transistor and the second supply voltage. In one embodiment, the voltage across the first capacitor is defined by a difference between the current supplied by the first current mirror and the current flowing through the third NMOS transistor.

In one embodiment, the current-mode clock driver circuit further includes a second biasing circuit that, in turn, includes a second current mirror, a second capacitor, and a second differential amplifier. The second differential amplifier includes a third PMOS transistor whose source terminal is responsive to the voltage of the common node. The second differential amplifier further includes a fourth PMOS transistor receiving a current generated by the second current minor and having a gate terminal coupled to the gate terminal of the third PMOS transistor.

In one embodiment, the voltage across the second capacitor is defined by the difference between the current supplied by the second current minor and the current flowing through the third PMOS transistor. In one embodiment, the voltage across the first capacitor is applied to the gate terminal of the second NMOS transistor, and the voltage across the second capacitor is applied to the gate terminal of the second PMOS transistor.

A method of driving a clock interconnect, in accordance with one embodiment of the present invention includes, in part, applying an oscillating signal to the gate terminal of a first PMOS transistor whose source terminal receives a first supply voltage, applying the oscillating signal to the gate terminal of a first NMOS transistor whose source terminal receives a second supply voltage, coupling the drain terminal of the first PMOS transistor to a first input terminal of a first variable conductivity circuit, coupling the drain terminal of the first NMOS transistor to a first input terminal of a second variable conductivity circuit, coupling output terminals of the first and second variable conductivity circuits to a common node, increasing conductivities of the first and second variable conductivity circuits in response to decreases in voltage swing of the common node, and decreasing the conductivities of the first and second variable conductivity circuits in response to increases in voltage swing of the common node.

In accordance with one embodiment, the first variable conductivity circuit is a PMOS transistor (second PMOS transistor) having a source terminal coupled to the drain terminal of the first PMOS transistor, and a drain terminal coupled to the common node. The second variable conductivity circuit is an NMOS transistor (second NMOS transistor) having a source terminal coupled to the drain terminal of the first NMOS transistor and a drain terminal coupled to the common node.

In one embodiment, varying the conductivity of the second NMOS transistor includes forming a first current minor, coupling the first current minor to a first capacitor, and forming a first differential amplifier. The first differential amplifier includes a third NMOS transistor whose source terminal is responsive to the voltage of the common node. The first differential amplifier may further include a fourth NMOS transistor that receives the current generated by the first current mirror and whose gate terminal is coupled to the gate terminal of the third NMOS transistor.

The method, in accordance with one embodiment, further includes coupling a resistive element between the source terminal of the fourth NMOS transistor and the second supply voltage. The method, in accordance with one embodiment, further includes forming a voltage across the first capacitor defined by the difference between the current supplied by the first current mirror and the current flowing through the third NMOS transistor.

In one embodiment, varying the conductivity of the second PMOS transistor includes forming a second current mirror, coupling the second current mirror to a second capacitor, and forming a second differential amplifier. The second differential amplifier may further include a third PMOS transistor whose source terminal is responsive to the voltage of the common node. The second differential amplifier may further include a fourth PMOS transistor that receives the current generated by the second current mirror and whose gate terminal is coupled to the gate terminal of the third PMOS transistor.

The method, in accordance with one embodiment, further includes forming a voltage across the second capacitor defined by the difference between the current supplied by the second current mirror and the current flowing through the third PMOS transistor. The method further includes applying the voltage of the first capacitor to the gate terminal of the second NMOS transistor, and applying the voltage of the second capacitor to the gate terminal of the second PMOS transistor.

A current-mode clock driver, in accordance with one embodiment of the present invention includes, in part, means for applying an oscillating signal to a gate terminal of a first PMOS transistor having a source terminal receiving a first supply voltage, means for applying the oscillating signal to a gate terminal of a first NMOS transistor a source terminal receiving a second supply voltage, means for coupling a drain terminal of the first PMOS transistor to a first input terminal of a first variable conductivity circuit, means for coupling a drain terminal of the first NMOS transistor to a first input terminal of a second variable conductivity circuit, means for coupling output terminals of the first and second variable conductivity circuits to a common node, means for increasing conductivities of the first and second variable conductivity circuits in response to decreases in voltage swing of the common node, and means for decreasing the conductivities of the first and second variable conductivity circuits in response to increases in voltage swing of the common node.

In one embodiment, the first variable conductivity circuit is a PMOS transistor (second PMOS transistor) having a source terminal coupled to the drain terminal of the first PMOS transistor and a drain terminal coupled to the common node. The second variable conductivity circuit is an NMOS transistor (second NMOS transistor) having a source terminal coupled to the drain terminal of the first NMOS transistor and a drain terminal coupled to the common node.

In one embodiment, the means for increasing or decreasing the conductivity of the second NMOS transistor further includes means for forming a first current mirror, means for coupling the first current mirror to a first capacitor, and means for forming a first differential amplifier having a third NMOS transistor whose source terminal is responsive to the voltage of the common node. The first differential amplifier may further include a fourth NMOS transistor that receives the current generated by the first current mirror and whose gate terminal is coupled to the gate terminal of the third NMOS transistor.

In one embodiment, the current-mode clock driver further includes, in part, means for coupling a resistive element between a source terminal of the fourth NMOS transistor and the second supply voltage. In one embodiment, the current-mode clock driver further includes, in part, means for forming a first voltage across the first capacitor defined by the difference between the current supplied by the first current mirror and the current flowing through the third NMOS transistor.

In one embodiment, the means for increasing or decreasing the conductivity of the second PMOS transistor further includes means for forming a second current mirror, means for coupling the second current mirror to a second capacitor, and means for forming a second differential amplifier having a third PMOS transistor whose source terminal is responsive to the voltage of the common node. The second differential amplifier may further include a fourth PMOS transistor that receives the current generated by the second current mirror and whose gate terminal is coupled to the gate terminal of the third PMOS transistor.

In one embodiment, the current-mode clock driver further includes, in part, means for forming a second voltage across the second capacitor defined by the difference between the current supplied by the second current minor and the current flowing through the third PMOS transistor.

In one embodiment, the current-mode clock driver further includes, in part, means for applying the first voltage to the gate terminal of the second NMOS transistor, and means for applying the second voltage to the gate terminal of the second PMOS transistor.

A non-transitory computer readable storage medium, in accordance with one embodiment of the present invention, includes instructions that when executed by a processor cause the processor to apply an oscillating signal to a gate terminal of a first PMOS transistor having a source terminal receiving a first supply voltage, apply the oscillating signal to a gate terminal of a first NMOS transistor having a source terminal receiving a second supply voltage, couple the drain terminal of the first PMOS transistor to a first input terminal of a first variable conductivity circuit, couple the drain terminal of the first NMOS transistor to a first input terminal of a second variable conductivity circuit, couple output terminals of the first and second variable conductivity circuits to a common node, increase conductivities of the first and second variable conductivity circuits in response to decreases in voltage swing of the common node, and decrease the conductivities of the first and second variable conductivity circuits in response to increases in voltage swing of the common node.

In accordance with one embodiment, the first variable conductivity circuit is a PMOS transistor (second PMOS transistor) having a source terminal coupled to the drain terminal of the first PMOS transistor and a drain terminal coupled to the common node. The second variable conductivity circuit is an NMOS transistor (second NMOS transistor) having a source terminal coupled to the drain terminal of the first NMOS transistor, and a drain terminal coupled to the common node.

In one embodiment, to vary the conductivity of the second NMOS transistor, the instructions further cause the processor to form a first current minor, couple the first current minor to a first capacitor, and form a first differential amplifier having a third NMOS transistor whose source terminal is responsive to the voltage of the common node. The first differential amplifier may further include a fourth NMOS transistor that receives the current generated by the first current mirror and whose gate terminal is coupled to the gate terminal of the third NMOS transistor.

In one embodiment, the instructions further cause the processor to couple a resistive element between the source terminal of the fourth NMOS transistor and the second supply voltage. In one embodiment, the instructions further cause the processor to form a voltage across the first capacitor defined by the difference between the current supplied by the first current mirror and the current flowing through the third NMOS transistor.

In one embodiment, to vary the conductivity of the second PMOS transistor, the instructions further cause the processor to form a second current mirror, couple the second current mirror to a second capacitor, and form a second differential amplifier having a third PMOS transistor whose source terminal is responsive to the voltage of the common node. The second differential amplifier may further include a fourth PMOS transistor that receives the current generated by the second current mirror and whose gate terminal is coupled to the gate terminal of the third PMOS transistor.

In one embodiment, the instructions further cause the processor to form a voltage across the second capacitor defined by the difference between the current supplied by the second current mirror and the current flowing through the third PMOS transistor. In one embodiment, the instructions further cause the processor to apply the voltage of the first capacitor to the gate terminal of the second NMOS transistor, and apply the voltage of the second capacitor to the gate terminal of the second PMOS transistor.

DETAILED DESCRIPTION OF THE INVENTION

Figure 1:
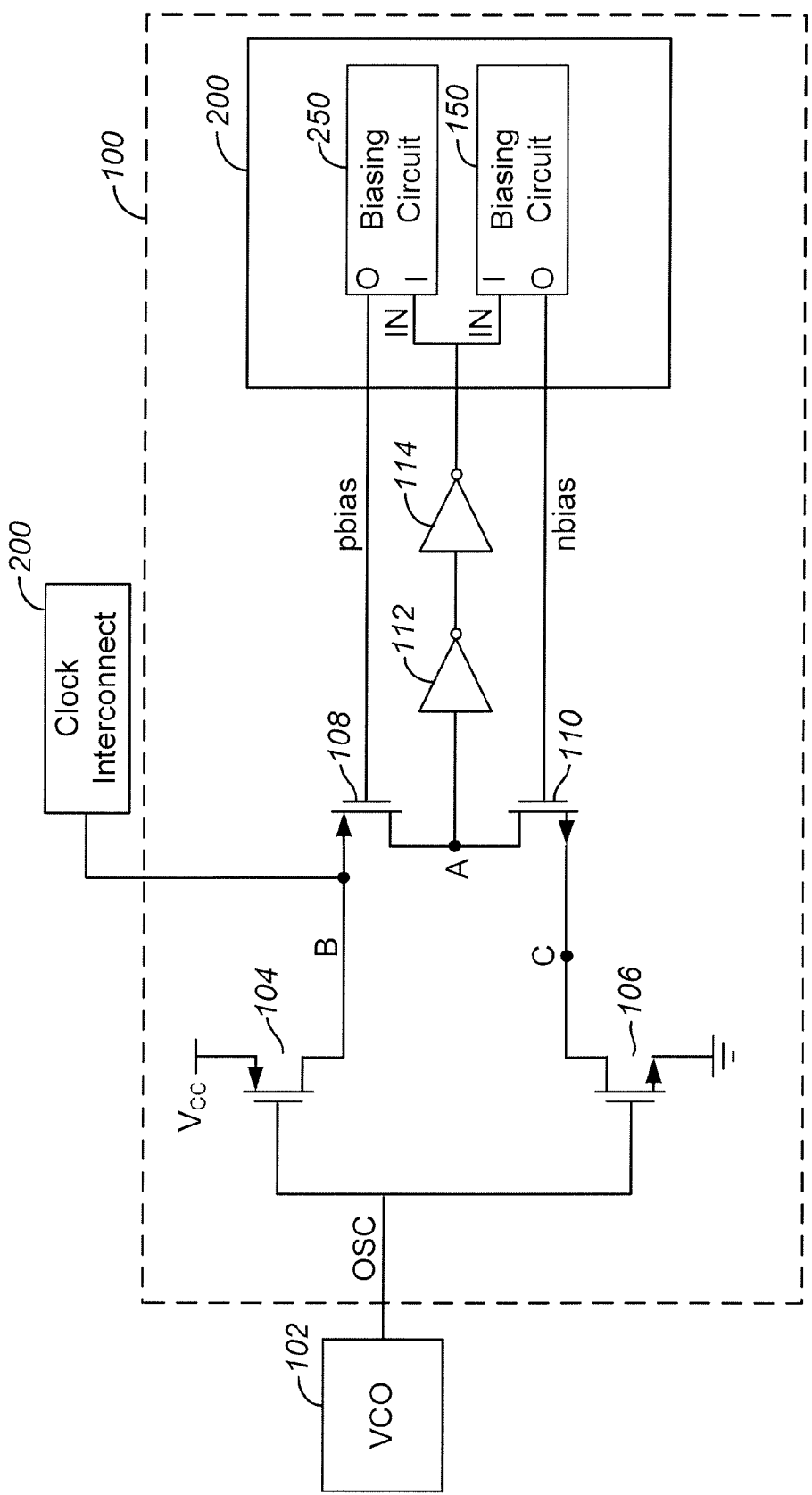
FIG. 1 is a simplified schematic diagram of a current-mode buffer adapted to drive a high-frequency clock interconnect, in accordance with one embodiment of the present invention.

FIG. 1 is a simplified schematic diagram of a current-mode buffer (alternatively referred to herein in as clock driver) 100 adapted to drive a high-frequency clock interconnect in accordance with one embodiment of the present invention. Clock driver 100 is shown as including PMOS transistors 104, 108, NMOS transistors 106, 110, inverters 112, 114, and control circuit 200. Control circuit 200 includes a biasing circuit 250 adapted to bias transistor 108, as well as biasing circuit 150 adapted to bias transistor 110.

Clock driver 100 is shown as receiving an oscillating signal OSC from voltage-controlled oscillator (VCO) 102, and driving clock interconnect 200 that may be distributed throughout one or more sections of an Integrated Circuit in which it is disposed. Voltage-controlled oscillator 102 may be part of a phase locked-loop, frequency locked-loop or any other controlled-loop circuit. As is seen from FIG. 1, oscillating signal OSC is applied to the gate terminals of PMOS transistor 104 and NMOS transistors 106.

When signal OSC is at a low value, PMOS transistor 104 is on and NMOS transistor 106 is off. Accordingly, when signal OSC is at a low value, node B is enabled to charge to the supply voltage VCC via transistor 104. Conversely, when signal OSC is at a high value, PMOS transistor 104 is off and NMOS transistor 106 is on. Accordingly, when signal OSC is at a high value, node C is enabled to discharge to the ground potential via transistor 106.

The drain terminal of transistor 104 is coupled to the source terminal of transistors 108. Likewise, the source terminal of transistor 110 is coupled to the drain terminal of transistor 106. The drain terminals of transistors 108, 110 are coupled to common node A and to the input terminal of inverter 112. The output terminal of inverter 112 is coupled to the input terminal of inverter 114 whose output terminal is coupled to the input terminals IN of biasing circuits 150, 250. The output terminal of biasing circuit 250 is coupled to the gate terminal of transistor 108. Likewise, the output terminal of biasing circuit 150 is coupled to the gate terminal of transistor 110.

Biasing circuit 250 is adapted to cause transistor 108 to be on when transistor 104 is on. Biasing circuit 250 is further adapted to cause transistor 108 to be off when transistor 104 is off. Likewise biasing circuit 150 is adapted to cause transistor 110 to be on when transistor 106 is on. Biasing circuit 150 is further adapted to cause transistor 110 to be off when transistor 106 is off.

Accordingly, when transistor 104 is on and transistor 106 is off, because transistors 108, 110 are on and off respectively, node A is charged to supply voltage Vcc via transistors 104, 108. Likewise, when transistor 106 is on and transistor 104 is off, because transistors 108, 110 are off and on respectively, node A is discharged to the ground potential via transistors 110, 106. The voltage at node A is buffered via inverters 112, 114 and applied to the input terminals IN of biasing circuits 150, 250. Node B, coupled to the source terminal of transistor 108, supplies a signal to clock interconnect 200, which in turn, is adapted to provide clock signals to various blocks of an integrated circuit in which clock diver 100 is disposed.

Figure 2:
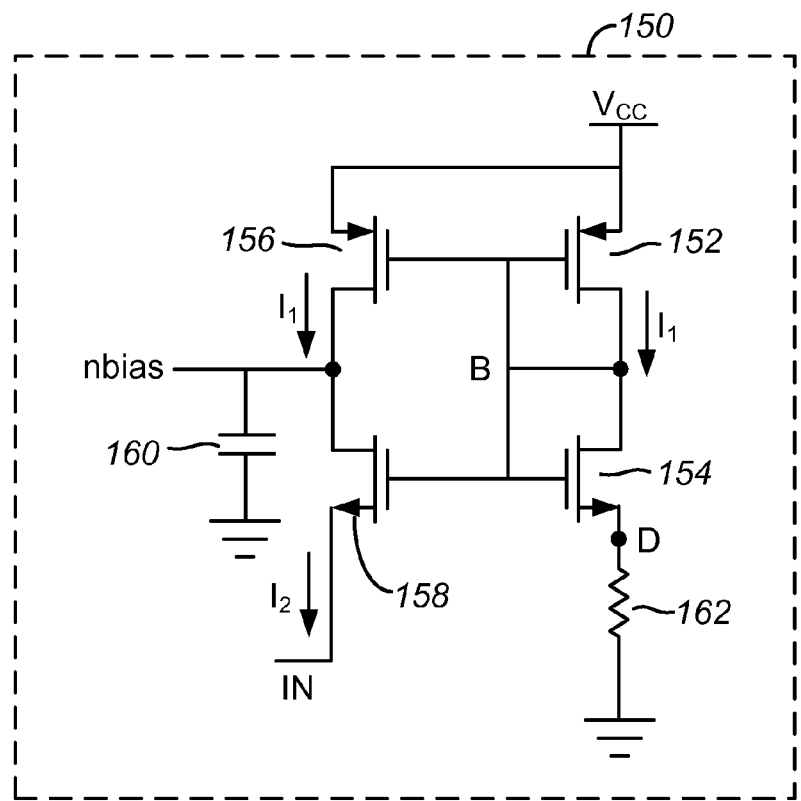
FIG. 2 is a simplified transistor schematic diagram of one of the biasing circuits of the current-mode buffer of FIG. 1, in accordance with one embodiment of the present invention.

FIG. 2 is a simplified transistor schematic diagram of an exemplary biasing circuit 150, in accordance with one embodiment of the present invention. Biasing circuit 150 is shown as including PMOS transistors 152, 156, NMOS transistors 154, 158, capacitor 160 and resistor 162. Transistors 152, 156 have the same gate-to-source voltage and form a current mirror. Resistor 162 is adapted to maintain the voltage of the source terminal of transistor 154, i.e., node D, above the ground potential. For example, in one embodiment, when the supply voltage VCC is 1.2 volts, node D is at 0.2 volts.

The gate terminals of transistors 152, 154, 156 and 158 are coupled to one another. The gate and drain terminals of transistors 152, 154 are also coupled to one another. Capacitor 160 has a first terminal coupled to the ground potential. The second terminal of capacitor 160 is coupled to node nbias and to the drain terminals of transistors 156, 158.

Biasing circuit 150 is adapted to operate differentially to compare the voltages of source terminals of transistors 154 and 158 to detect the minimum voltage of the source terminal of transistor 158, i.e., the minimum voltage of terminal IN. As described above, PMOS transistors 152, 156 form a current mirror and thus generate the same current $I_1$. Accordingly, if the voltage at node IN increases, because of the decrease in the gate-to-source voltage of transistor 158, the current through transistor 158 decreases. Since the current $I_1$ flowing through transistor 156 is relatively constant, the decrease in the current flow through transistor 158 causes more current to flow and charge capacitor 160, thereby causing the voltage of node nbias to increase.

Conversely, if the voltage at node IN decreases, because of the increase in the gate-to-source voltage of transistor 158, the current through transistor 158 increases. Since the current $I_1$ flowing through transistor 156 is relatively constant, the increase in the current flow through transistor 158 causes current to be withdrawn from capacitor 160, thereby causing the voltage of node nbias to decrease.

Figure 3:
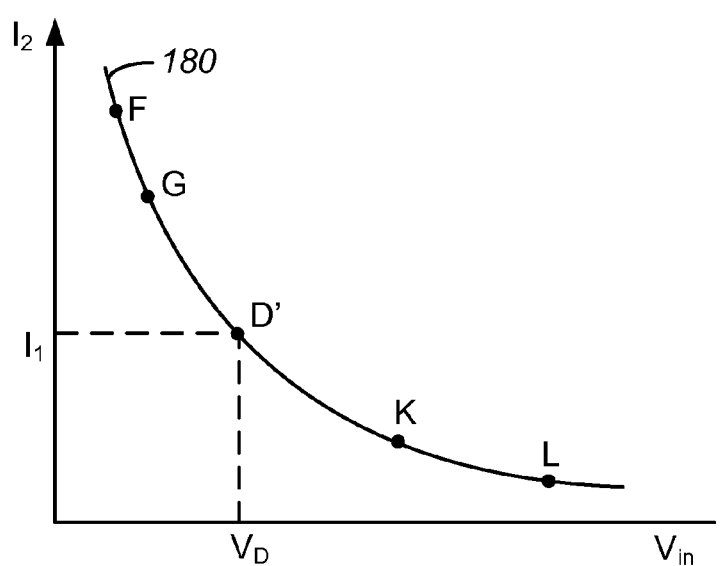
FIG. 3 shows the relationship between the current flowing through and the source voltage of one of the transistors disposed in the biasing circuit of FIG. 2.

FIG. 3 shows a plot 180 indicating the relationship between the current flow $I_2$ through transistor 158 and the voltage $V_{IN}$ received by the source terminal of transistor 158. As seen from FIG. 3, current $I_2$ has an inverse relationship with voltage $V_{IN}$, decreasing when $V_{IN}$ increases and increasing when $V_{IN}$ decreases. Voltage $V_D$ of node D and the corresponding current $I_1$ flowing through node D is identified in plot 180 as point D'.

As is seen from FIG. 3, plot 180 has a relatively high slope when voltage $V_{IN}$ is small (for example, between points F and G), and a relatively low slope when voltage $V_{IN}$ is large (for example, between points K and L). Accordingly, the voltage across capacitor 160 is mostly defined by the near minimum values of voltage $V_{IN}$. In other words, biasing circuit 150 is a minimum peak detector adapted to detect the near minimum value of voltage $V_{IN}$—seen by its input terminal IN—and generate a voltage at its output terminal nbias that is defined by the detected minimum voltage. The larger the voltage swing at node IN and thereby the longer the time when the voltage at node IN is smaller than the voltage of node D, the greater is the voltage at node nbias. As is seen from FIG. 1, output terminal nbias of biasing circuit 150 is coupled to the gate terminal of transistor 110.

Figure 4:
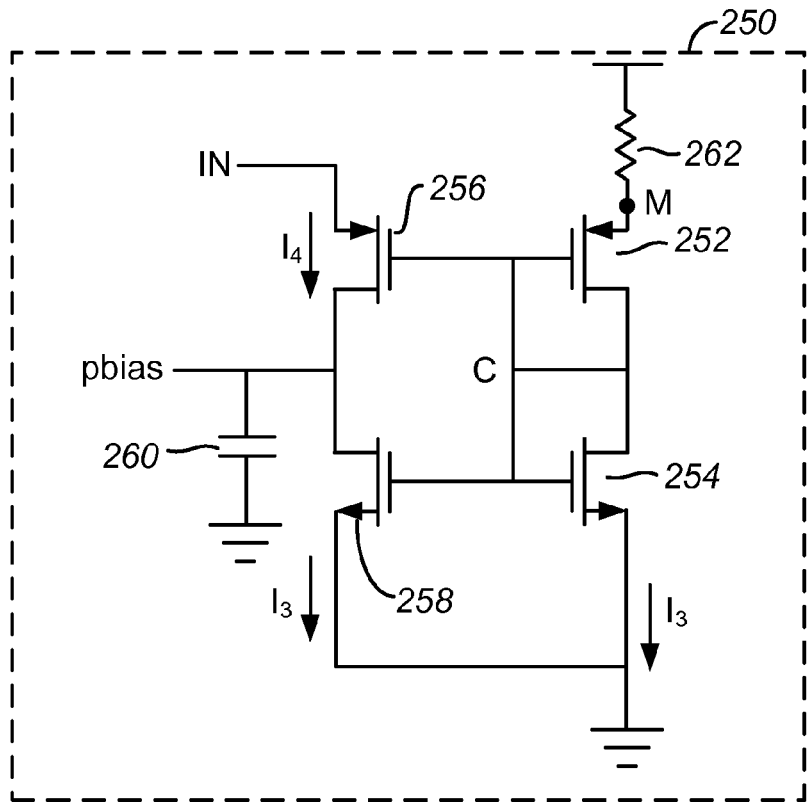
FIG. 4 is a simplified transistor schematic diagram of another one of the biasing circuits of the current-mode buffer of FIG. 1, in accordance with one embodiment of the present invention.

FIG. 4 is a simplified transistor schematic diagram of an exemplary biasing circuit 250, in accordance with one embodiment of the present invention. Biasing circuit 250 is shown as including PMOS transistors 252, 256, NMOS transistors 254, 258, capacitor 260 and resistor 262. Transistors 258, 254 have the same gate-to-source voltage and form a current minor. Resistor 262 is adapted to maintain the voltage at the source terminal of transistor 154, i.e., node M, below the supply voltage Vcc. For example, in one embodiment, when the supply voltage VCC is 1.2 volts, node M may be at 1.0 volts.

The gate terminals of transistors 252, 254, 256 and 258 are coupled to one another. The gate and drain terminals of transistors 252, 254 are also coupled to one another. Capacitor 260 has a first terminal coupled to the ground potential. The second terminal of capacitor 260 is coupled to node pbias and to the drain terminals of transistors 256, 258.

Biasing circuit 250 is adapted to operate differentially to compare the voltages of source terminals of transistors 256 and 262 to detect the peak voltage of the source terminal of transistor 256, i.e., the peak voltage of terminal IN. As described above, NMOS transistors 254, 258 form a current minor and thus generate the same current $I_3$. Accordingly, if the voltage at node (terminal) IN increases, because of the increase in the gate-to-source voltage of transistor 256, the current through transistor 256 increases. Since the current $I_3$ flowing through transistor 258 is relatively constant, the increase in the current flow through transistor 256 causes more current to flow and charge capacitor 260, thereby causing the voltage of node pbias to increase.

Conversely, if the voltage at node IN decreases, because of the decrease in the gate-to-source voltage of transistor 256, the current through transistor 256 decreases. Since the current $I_3$ flowing through transistor 258 is relatively constant, the decrease in the current flow through transistor 256 causes capacitor 260 to discharge, thereby causing the voltage of node pbias to decrease.

Figure 5:
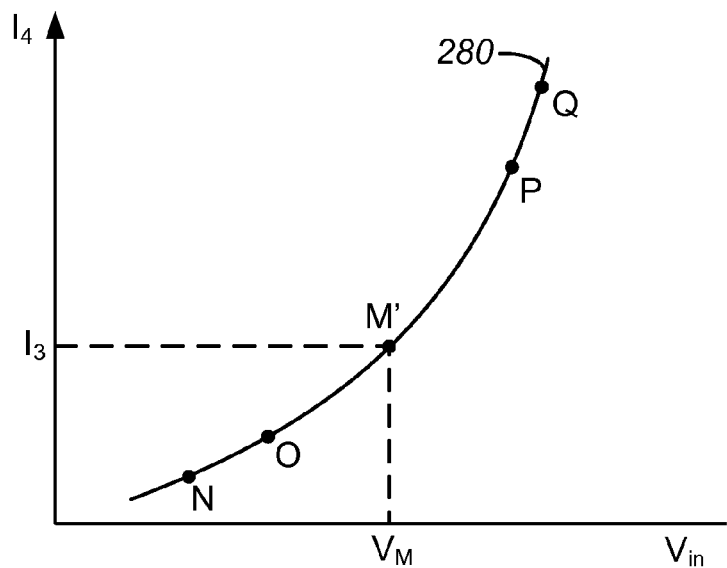
FIG. 5 shows the relationship between the current flowing through and the source voltage of one of the transistors disposed in the biasing circuit of FIG. 5.

FIG. 5 shows a plot 280 indicating the relationship between the current flow $I_4$ through transistor 258 and the voltage $V_{IN}$ received by the source terminal of transistor 258. As seen from FIG. 5, current $I_4$ has a direct relationship with voltage $V_{IN}$, decreasing when $V_{IN}$ decreases, and increasing when $V_{IN}$ increases. Voltage $V_M$ of node M and the corresponding current $I_3$ flowing through node M is identified in plot 180 as point M'.

As is seen from FIG. 5, plot 280 has a relatively high slope when voltage $V_{IN}$ is large (for example, between points P and Q), and a relatively low slope when voltage $V_{IN}$ is small (for example, between points N and O). Accordingly, the voltage across capacitor 260 is mostly defined by the near maxim values of voltage $V_{IN}$. In other words, biasing circuit 250 is a peak detector adapted to detect the near peak value of voltage $V_{IN}$—seen by its input terminal IN—and generate a voltage at its output terminal pbias that is defined by this detected peak voltage. The larger the voltage swing at node IN and thereby the longer the time when the voltage at node IN is larger than the voltage of node M, the greater is the DC voltage at node pbias. As is seen from FIG. 1, output terminal pbias of biasing circuit 250 is coupled to the gate terminal of transistor 108.

Referring to FIGS. 1, 2 and 4 concurrently, as the voltage swing of node IN increases and thereby the peak and minimum voltages of node IN increase and decrease respectively, the voltage at node pbias increases and the voltage at node nbias decreases. This causes transistors 108, 110 to become less conductive, thereby causing the voltage swing of node IN to decrease. Likewise, as the voltage swing of node IN decreases, the voltage at node pbias decreases and the voltage at node nbias increases. This causes transistors 108, 110 to become more conductive, thereby causing the voltage swing of node IN to increase. Accordingly, the feedback loop formed by transistors 108, 110 and control circuitry 200 is adapted to minimize the variations of the voltage at node IN.

Figure 6:
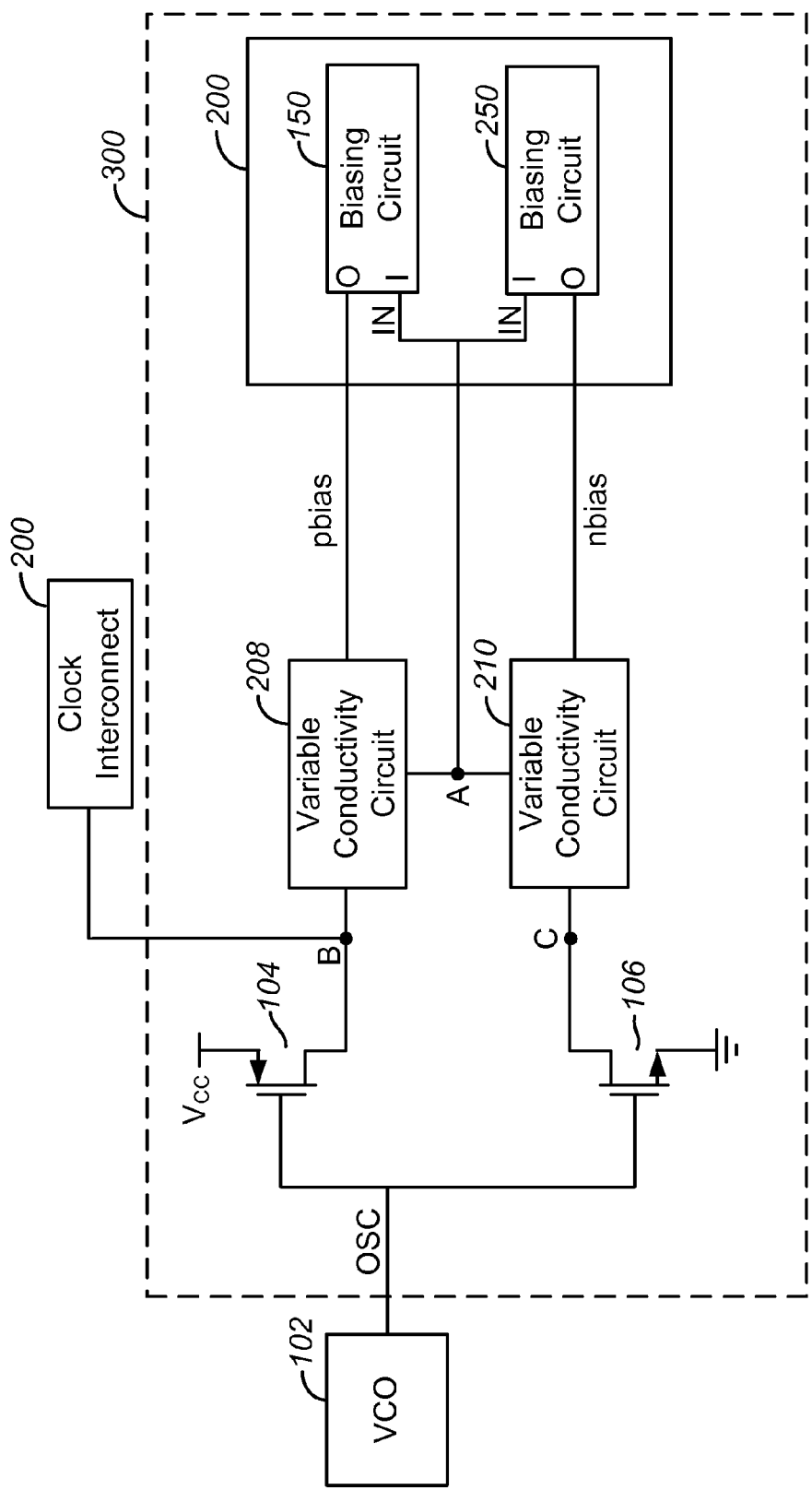
FIG. 6 is a simplified schematic diagram of a current-mode clock driver adapted to drive a high-frequency clock interconnect in accordance with another embodiment of the present invention.

FIG. 6 is a simplified schematic diagram of a current-mode clock driver 300 adapted to drive a high-frequency clock interconnect in accordance with another embodiment of the present invention. Clock driver 300 is similar to clock driver 100 except that clock driver 300 includes first and second variable conductivity circuits 208, 210 in place of transistors 108, 110 of clock driver 100.

The drain terminal of transistor 104 is coupled to a first input terminal of variable conductivity circuit 208. Likewise, the drain terminal of transistor 106 is coupled to a first input terminal of variable conductivity circuit 210. Output terminals pbias and nbias of control circuit 200 are respectively applied to the second input terminals of first and second conductivity circuits 208, 210. The output terminals of first and second conductivity circuits 208, 210 are coupled to a common node A and to the input terminals IN of first and second biasing circuits 150, 250.

Biasing circuit 150 is adapted to cause variable conductivity circuit 208 to be on when transistor 104 is on. Biasing circuit 150 is further adapted to cause variable conductivity circuit 208 to be off when transistor 104 is off. Likewise biasing circuit 250 is adapted to cause variable conductivity circuit 210 to be on when transistor 106 is on/off. Biasing circuit 250 is further adapted to cause variable conductivity circuit 210 to be off when transistor 104 is off.

As the voltage swing of node IN increases and thereby the peak and minimum voltages of node IN increase and decrease respectively, the voltage at node pbias increases and the voltage at node nbias decreases. This causes variable conductivity circuits 208, 210 to become less conductive, thereby causing the voltage swing of node IN to decrease. Likewise, as the voltage swing of node IN decreases, the voltage at node pbias decreases and the voltage at node nbias increases. This causes variable conductivity circuits 208, 210 to become more conductive, thereby causing the voltage swing of node IN to increase. Accordingly, the feedback loop formed by variable conductivity circuits 208, 210 and control circuitry 200 is adapted to minimize the variations of the voltage at node IN.

The above embodiments of the present invention are illustrative and not limitative. Embodiments of the present invention are not limited by the variable conductivity circuit used in the clock driver. Embodiments of the present invention are not limited by the type of device, wireless or otherwise, in which the clock driver circuit may be disposed. Other additions, subtractions or modifications are obvious in view of the present disclosure and are intended to fall within the scope of the appended claims.

What is claimed is:

1. A current-mode driver circuit comprising:
    a first PMOS transistor having a gate terminal receiving an oscillating signal and a source terminal receiving a first supply voltage;
    a first NMOS transistor having a gate terminal receiving the oscillating signal and a source terminal receiving a second supply voltage;
    a first variable conductivity circuit having a first input terminal coupled to a drain terminal of the first PMOS transistor and an output terminal coupled to a common node;
    a second variable conductivity circuit having a first input terminal coupled to a drain terminal of the first NMOS transistor, said second variable conductivity circuit having an output terminal coupled to the common node; and
    a control circuit adapted to increase conductivities of the first and second variable conductivity circuits in response to decreases in voltage swing of the common node, said control circuit further adapted to decrease the conductivities of the first and second variable conductivity circuits in response to increases in voltage swing of the common node, and
    wherein the control circuit comprises a first biasing circuit, said first biasing circuit comprising:
    a first current mirror;
    a first capacitor; and
    a first differential amplifier comprising a second NMOS transistor having a source terminal responsive to the voltage of the common node.

2. The current-mode clock driver circuit of claim 1 wherein said first variable conductivity circuit is a second PMOS transistor having a source terminal coupled to a drain terminal of the first PMOS transistor and a drain terminal coupled to the common node.

3. The current-mode clock driver circuit of claim 2 wherein said second variable conductivity circuit is a third NMOS transistor having a source terminal coupled to a drain terminal of the first NMOS transistor and a drain terminal coupled to the common node.

4. The current-mode clock driver circuit of claim 3 wherein the first differential amplifier further comprises a fourth NMOS transistor receiving a current generated by the first current mirror and having a gate terminal coupled to a gate terminal of the second NMOS transistor.

5. The current-mode clock driver circuit of claim 4 further comprising a resistive element coupled between a source terminal of the fourth NMOS transistor and the second supply voltage.

6. The current-mode clock driver circuit of claim 5 wherein a voltage across the first capacitor is defined by a difference between a current supplied by the first current mirror and a current flowing through the second NMOS transistor.

7. The current-mode clock driver circuit of claim 6 wherein the control circuit further comprises a second biasing circuit, said second biasing circuit comprising:
    a second current mirror;
    a second capacitor; and
    a second differential amplifier comprising a third PMOS transistor having a source terminal responsive to the voltage of the common node.

8. The current-mode clock driver circuit of claim 7 wherein the second differential amplifier further comprises a fourth PMOS transistor receiving a current generated by the second current mirror and having a gate terminal coupled to a gate terminal of the third PMOS transistor.

9. The current-mode clock driver circuit of claim 8 wherein a voltage across the second capacitor is defined by a difference between a current supplied by the second current mirror and a current flowing through the third PMOS transistor.

10. The current-mode clock driver of claim 9 wherein the voltage across the first capacitor is applied to a gate terminal of the third NMOS transistor.

11. The current-mode clock driver of claim 10 wherein the voltage across the second capacitor is applied to a gate terminal of the second PMOS transistor.

12. A method of driving a clock interconnect, the method comprising:
    applying an oscillating signal to a gate terminal of a first PMOS transistor having a source terminal receiving a first supply voltage;
    applying the oscillating signal to a gate terminal of a first NMOS transistor having a source terminal receiving a second supply voltage;
    coupling a drain terminal of the first PMOS transistor to a first input terminal of a first variable conductivity circuit;
    coupling a drain terminal of the first NMOS transistor to a first input terminal of a second variable conductivity circuit;
    coupling output terminals of the first and second variable conductivity circuits to a common node;
    increasing conductivities of the first and second variable conductivity circuits in response to decreases in voltage swing of the common node; and
    decreasing the conductivities of the first and second variable conductivity circuits in response to increases in voltage swing of the common node, and
    wherein varying the conductivity of the second variable conductivity circuit comprises:
    forming a first current mirror;
    coupling the first current mirror to a first capacitor; and
    forming a first differential amplifier comprising a second NMOS transistor having a source terminal responsive to the voltage of the common node.

13. The method of claim 12 wherein said first variable conductivity circuit is a second PMOS transistor having a source terminal coupled to a drain terminal of the first PMOS transistor and a drain terminal coupled to the common node.

14. The method of claim 13 wherein said second variable conductivity circuit is a third NMOS transistor having a source terminal coupled to a drain terminal of the first NMOS transistor and a drain terminal coupled to the common node.

15. The method of claim 14 wherein the first differential amplifier further comprises a fourth NMOS transistor receiving a current generated by the first current mirror and having a gate terminal coupled to a gate terminal of the second NMOS transistor.

16. The method of claim 15 further comprising:
coupling a resistive element between a source terminal of the fourth NMOS transistor and the second supply voltage.

17. The method of claim 16 further comprising:
forming a voltage across the first capacitor defined by a difference between a current supplied by the first current mirror and a current flowing through the second NMOS transistor.

18. The method of claim 17 wherein varying the conductivity of the second PMOS transistor comprises:
forming a second current mirror;
coupling the second current mirror to a second capacitor; and
forming a second differential amplifier comprising a third PMOS transistor having a source terminal responsive to the voltage of the common node.

19. The method of claim 18 wherein the second differential amplifier further comprises a fourth PMOS transistor receiving a current generated by the second current mirror and having a gate terminal coupled to a gate terminal of the third PMOS transistor.

20. The method of claim 19 further comprising:
forming a voltage across the second capacitor defined by a difference between a current supplied by the second current mirror and a current flowing through the third PMOS transistor.

21. The method of claim 20 further comprising:
applying the voltage of the first capacitor to a gate terminal of the third NMOS transistor.

22. The method of claim 21 further comprising:
applying the voltage of the second capacitor to a gate terminal of the second PMOS transistor.

23. A current-mode clock driver comprising:
means for applying an oscillating signal to a gate terminal of a first PMOS transistor having a source terminal receiving a first supply voltage;
means for applying the oscillating signal to a gate terminal of a first NMOS transistor having a source terminal receiving a second supply voltage;
means for coupling a drain terminal of the first PMOS transistor to a first input terminal of a first variable conductivity circuit;
means for coupling a drain terminal of the first NMOS transistor to a first input terminal of a second variable conductivity circuit;
means for coupling output terminals of the first and second variable conductivity circuits to a common node;
means for increasing conductivities of the first and second variable conductivity circuits in response to decreases in voltage swing of the common node; and
means for decreasing the conductivities of the first and second variable conductivity circuits in response to increases in voltage swing of the common node, and wherein said means for increasing or decreasing the conductivity of the second variable conductivity circuit further comprises:
means for forming a first current mirror;
means for coupling the first current mirror to a first capacitor; and
means for forming a first differential amplifier comprising a second NMOS transistor having a source terminal responsive to the voltage of the common node.

24. The current-mode clock driver of claim 23 wherein said first variable conductivity circuit is a second PMOS transistor having a source terminal coupled to a drain terminal of the first PMOS transistor and a drain terminal coupled to the common node.

25. The current-mode clock driver of claim 24 wherein said second variable conductivity circuit is a third NMOS transistor having a source terminal coupled to a drain terminal of the first NMOS transistor and a drain terminal coupled to the common node.

26. The current-mode clock driver of claim 25 wherein the first differential amplifier further comprises a fourth NMOS transistor receiving a current generated by the first current mirror and having a gate terminal coupled to a gate terminal of the second NMOS transistor.

27. The current-mode clock driver of claim 26 further comprising:
means for coupling a resistive element between a source terminal of the fourth NMOS transistor and the second supply voltage.

28. The current-mode clock driver of claim 27 further comprising:
means for forming a first voltage across the first capacitor, said first voltage being defined by a difference between a current supplied by the first current mirror and a current flowing through the second NMOS transistor.

29. The current-mode clock driver of claim 28 wherein said means for increasing or decreasing the conductivity of the second PMOS transistor further comprises:
means for forming a second current mirror;
means for coupling the second current mirror to a second capacitor; and
means for forming a second differential amplifier comprising a third PMOS transistor having a source terminal responsive to the voltage of the common node.

30. The current-mode clock driver of claim 29 wherein the second differential amplifier further comprises a fourth PMOS transistor receiving a current generated by the second current mirror and having a gate terminal coupled to a gate terminal of the third PMOS transistor.

31. The current-mode clock driver of claim 30 further comprising:
means for forming a second voltage across the second capacitor, said second voltage defined by a difference between a current supplied by the second current mirror and a current flowing through the third PMOS transistor.

32. The current-mode clock driver of claim 31 further comprising:
means for applying the first voltage to a gate terminal of the third NMOS transistor.

33. The current-mode clock driver of claim 32 further comprising:
means for applying the second voltage to a gate terminal of the second PMOS transistor.

34. A non-transitory computer readable storage medium comprising instructions that when executed by a processor cause the processor to:
apply an oscillating signal to a gate terminal of a first PMOS transistor having a source terminal receiving a first supply voltage;
apply the oscillating signal to a gate terminal of a first NMOS transistor having a source terminal receiving a second supply voltage;
couple a drain terminal of the first PMOS transistor to a first input terminal of a first variable conductivity circuit;

couple a drain terminal of the first NMOS transistor to a first input terminal of a second variable conductivity circuit;

couple output terminals of the first and second variable conductivity circuits to a common node;

increase conductivities of the first and second variable conductivity circuits in response to decreases in voltage swing of the common node; and decrease the conductivities of the first and second variable conductivity circuits in response to increases in voltage swing of the common node, and wherein said instructions further cause the processor to:

form a first current mirror;

couple the first current mirror to a first capacitor; and form a first differential amplifier comprising a second NMOS transistor having a source terminal responsive to the voltage of the common node, thereby to vary the conductivity of the second variable conductivity circuit.

35. The non-transitory computer readable storage medium of claim 34 wherein said first variable conductivity circuit is a second PMOS transistor having a source terminal coupled to a drain terminal of the first PMOS transistor and a drain terminal coupled to the common node.

36. The non-transitory computer readable storage medium of claim 35 wherein said second variable conductivity circuit is a third NMOS transistor having a source terminal coupled to a drain terminal of the first NMOS transistor and a drain terminal coupled to the common node.

37. The non-transitory computer readable storage medium of claim 36 wherein the first differential amplifier further comprises a fourth NMOS transistor receiving a current generated by the first current mirror and having a gate terminal coupled to a gate terminal of the second NMOS transistor.

38. The non-transitory computer readable storage medium of claim 37 wherein said instructions further cause the processor to:

couple a resistive element between a source terminal of the fourth NMOS transistor and the second supply voltage.

39. The non-transitory computer readable storage medium of claim 38 wherein said instructions further cause the processor to:

form a voltage across the first capacitor defined by a difference between a current supplied by the first current mirror and a current flowing through the second NMOS transistor.

40. The non-transitory computer readable storage medium of claim 39 wherein said instructions further cause the processor to:

form a second current mirror;

couple the second current mirror to a second capacitor; and form a second differential amplifier comprising a third PMOS transistor having a source terminal responsive to the voltage of the common node, thereby to vary the conductivity of the second PMOS transistor.

41. The non-transitory computer readable storage medium of claim 40 wherein the second differential amplifier further comprises a fourth PMOS transistor receiving a current generated by the second current mirror and having a gate terminal coupled to a gate terminal of the third PMOS transistor.

42. The non-transitory computer readable storage medium of claim 41 wherein said instructions further cause the processor to:

form a voltage across the second capacitor defined by a difference between a current supplied by the second current mirror and a current flowing through the third PMOS transistor.

43. The non-transitory computer readable storage medium of claim 42 wherein said instructions further cause the processor to:

apply the voltage of the first capacitor to a gate terminal of the third NMOS transistor.

44. The non-transitory computer readable storage medium of claim 43 wherein said instructions further cause the processor to:

apply the voltage of the second capacitor to a gate terminal of the second PMOS transistor.

\* \* \* \* \*